US006759737B2

(12) United States Patent
Seo et al.

(10) Patent No.: US 6,759,737 B2
(45) Date of Patent: Jul. 6, 2004

(54) SEMICONDUCTOR PACKAGE INCLUDING STACKED CHIPS WITH ALIGNED INPUT/OUTPUT PADS

(75) Inventors: Seong Min Seo, Seoul (KR); Young Suk Chung, Seoul (KR); Jong Sik Paek, Seoul (KR); Jae Hun Ku, Singapore (SG); Jae Hak Yee, Singapore (SG)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/816,599

(22) Filed: Mar. 23, 2001

(65) Prior Publication Data

US 2003/0001252 A1 Jan. 2, 2003

(30) Foreign Application Priority Data

Mar. 25, 2000 (KR) ........................................ 2000-15305

(51) Int. Cl.[7] .............................................. H01L 23/02
(52) U.S. Cl. ...................... 257/686; 257/685; 257/666; 257/692; 257/787
(58) Field of Search ................................ 257/685, 686, 257/666, 690, 692, 701, 787

(56) References Cited

U.S. PATENT DOCUMENTS

| | | | |
|---|---|---|---|
| 3,833,984 A | 9/1974 | Dietzel ....................... 29/193.5 |
| 3,851,221 A | 11/1974 | Beaulieu et al. ............ 317/100 |
| 4,530,152 A | 7/1985 | Roche et al. .................. 29/588 |
| 4,567,643 A | 2/1986 | Droguet et al. ............... 29/575 |
| 4,707,724 A | 11/1987 | Suzuki et al. .................. 357/71 |
| 4,730,232 A | 3/1988 | Lindberg ..................... 361/381 |
| 4,756,080 A | 7/1988 | Thorp, Jr. et al. ............ 29/827 |
| 4,763,188 A | 8/1988 | Johnson ........................ 357/74 |
| 4,812,896 A | 3/1989 | Rothgery et al. ............. 357/70 |
| 4,982,265 A | 1/1991 | Watanabe et al. ............. 357/75 |
| 4,996,587 A | 2/1991 | Hinrichsmeyer et al. ..... 357/74 |
| 5,012,323 A | 4/1991 | Farnworth .................... 357/75 |
| 5,025,306 A | 6/1991 | Johnson et al. ............... 357/75 |
| 5,040,052 A | 8/1991 | McDavid ...................... 357/80 |
| 5,041,902 A | 8/1991 | McShane ...................... 357/79 |
| 5,138,438 A | 8/1992 | Masayuki et al. ............ 357/75 |
| 5,140,404 A | 8/1992 | Fogal et al. .................. 357/70 |
| 5,157,480 A | 10/1992 | McShane et al. ............. 357/74 |
| 5,165,067 A | 11/1992 | Wakefield et al. .......... 257/783 |
| 5,172,213 A | 12/1992 | Zimmerman ................ 257/796 |

(List continued on next page.)

FOREIGN PATENT DOCUMENTS

| | | | |
|---|---|---|---|
| DE | 197 34 794 | 8/1997 | ........... H01L/23/50 |
| EP | 503 201 A2 | 12/1991 | ......... H01L/23/495 |
| EP | 794 572 A2 | 9/1997 | ......... H01L/23/495 |
| JP | 54-128274 | 4/1979 | ........... H01L/23/30 |
| JP | 55-153868 | 12/1980 | ........... H01L/23/48 |

(List continued on next page.)

Primary Examiner—Nathan J Flynn
Assistant Examiner—Pershelle Greene
(74) Attorney, Agent, or Firm—Stetina Brunda Garred & Brucker

(57) ABSTRACT

Semiconductor packages are disclosed. An exemplary package includes horizontal leads each having a first side and an opposite second side. The second side includes a recessed horizontal surface. Two stacked semiconductor chips are within the package and are electrically interconnected in a flip chip style. One chip extends over the first side of the leads and is electrically connected thereto. The chips are encapsulated in a package body formed of an encapsulating material. The recessed horizontal surface of the leads is covered by the encapsulating material, and a portion of the second side of each lead is exposed at an exterior surface of the package body as an input/output terminal. A surface of one or both chips may be exposed. The stack of chips may be supported on the first side of the leads or on a chip mounting plate.

24 Claims, 3 Drawing Sheets

U.S. PATENT DOCUMENTS

| | | | |
|---|---|---|---|
| 5,172,214 A | 12/1992 | Casto | 257/676 |
| 5,198,888 A | 3/1993 | Sugano et al. | 257/687 |
| 5,200,809 A | 4/1993 | Kwon | 257/707 |
| 5,214,845 A | 6/1993 | King et al. | 29/841 |
| 5,216,278 A | 6/1993 | Lin et al. | 257/688 |
| 5,221,642 A | 6/1993 | Burns | 437/207 |
| 5,229,647 A | 7/1993 | Gnadinger | 257/785 |
| 5,258,094 A | 11/1993 | Furui et al. | 156/634 |
| 5,273,938 A | 12/1993 | Lin et al. | 437/207 |
| 5,277,972 A | 1/1994 | Sakumoto et al. | 428/355 |
| 5,278,446 A | 1/1994 | Nagaraj et al. | 257/707 |
| 5,279,029 A | 1/1994 | Burns | 29/856 |
| 5,291,061 A | 3/1994 | Ball | 257/686 |
| 5,323,060 A | 6/1994 | Fogal et al. | 257/777 |
| 5,332,864 A | 7/1994 | Liang et al. | 174/52.4 |
| 5,334,875 A | 8/1994 | Sugano et al. | 257/666 |
| 5,336,931 A | 8/1994 | Juskey et al. | 257/787 |
| 5,343,076 A | 8/1994 | Katayama et al. | 257/717 |
| 5,347,429 A | 9/1994 | Kohno et al. | 361/813 |
| 5,406,124 A | 4/1995 | Morita et al. | 257/783 |
| 5,422,435 A | 6/1995 | Takiar et al. | 174/52.4 |
| 5,424,576 A | 6/1995 | Djennas et al. | 257/666 |
| 5,426,563 A | 6/1995 | Moresco et al. | 361/689 |
| 5,432,729 A | 7/1995 | Carson et al. | 365/63 |
| 5,435,057 A | 7/1995 | Bindra et al. | 29/830 |
| 5,463,253 A | 10/1995 | Waki et al. | 257/724 |
| 5,473,196 A | 12/1995 | De Givry | 257/786 |
| 5,495,394 A | 2/1996 | Kornfeld et al. | 361/764 |
| 5,495,398 A | 2/1996 | Takiar et al. | 361/790 |
| 5,502,289 A | 3/1996 | Takiar et al. | 174/52.4 |
| 5,514,907 A | 5/1996 | Moshayedi | 257/723 |
| 5,521,429 A | 5/1996 | Aono et al. | 257/676 |
| 5,569,625 A | 10/1996 | Yoneda et al. | 29/827 |
| 5,581,498 A | 12/1996 | Ludwig et al. | 365/63 |
| 5,587,341 A | 12/1996 | Masayuki et al. | 437/206 |
| 5,604,376 A | 2/1997 | Hamburgen et al. | 257/676 |
| 5,608,267 A | 3/1997 | Mahulikar et al. | 257/796 |
| 5,614,766 A | 3/1997 | Takasu et al. | 257/777 |
| 5,637,536 A | 6/1997 | Val | 438/686 |
| 5,637,912 A | 6/1997 | Cockerill et al. | 257/620 |
| 5,639,990 A | 6/1997 | Nishihara et al. | 174/52.2 |
| 5,640,047 A | 6/1997 | Nakashima | 257/738 |
| 5,641,997 A | 6/1997 | Ohta et al. | 257/788 |
| 5,646,831 A | 7/1997 | Manteghi | 361/813 |
| 5,650,663 A | 7/1997 | Parthasarathi | 257/706 |
| 5,682,062 A | 10/1997 | Gaul | 257/686 |
| 5,683,806 A | 11/1997 | Sakumoto et al. | 428/343 |
| 5,689,135 A | 11/1997 | Ball | 257/676 |
| 5,696,031 A | 12/1997 | Wark | 437/209 |
| 5,696,666 A | 12/1997 | Miles et al. | 361/764 |
| 5,701,034 A | 12/1997 | Marrs | 257/706 |
| 5,710,064 A | 1/1998 | Song et al. | 437/220 |
| 5,715,147 A | 2/1998 | Nagano | 361/813 |
| 5,721,452 A | 2/1998 | Fogal et al. | 257/685 |
| 5,736,432 A | 4/1998 | Mackessy | 438/123 |
| 5,739,581 A | 4/1998 | Chillara et al. | 257/668 |
| 5,776,798 A | 7/1998 | Quan et al. | 438/112 |
| 5,783,861 A | 7/1998 | Son | 253/693 |
| 5,783,870 A | 7/1998 | Mostafazadeh et al. | 257/791 |
| 5,793,108 A | 8/1998 | Nakanishi et al. | 257/723 |
| 5,798,014 A | 8/1998 | Weber | 156/263 |
| 5,815,372 A | 9/1998 | Gallas | 361/760 |
| 5,835,988 A | 11/1998 | Ishii | 257/684 |
| 5,859,471 A | 1/1999 | Kuraishi et al. | 257/666 |
| 5,861,666 A | 1/1999 | Bellaar | 257/686 |
| 5,866,939 A | 2/1999 | Shin et al. | 257/666 |
| 5,872,025 A | 2/1999 | Cronin et al. | 438/109 |
| 5,877,043 A | 3/1999 | Alcoe et al. | 438/123 |
| 5,885,849 A | 3/1999 | DiStefano et al. | 438/108 |
| 5,886,412 A | 3/1999 | Fogal et al. | 257/777 |
| 5,894,108 A | 4/1999 | Mostafazadeh et al. | 174/52.4 |
| 5,917,242 A | 6/1999 | Ball | 257/737 |
| 5,952,611 A | 9/1999 | Eng et al. | 174/52.4 |
| 5,973,403 A | 10/1999 | Wark | 257/777 |
| 5,977,613 A | 11/1999 | Takata et al. | 257/666 |
| 5,977,630 A | 11/1999 | Woodworth et al. | 257/712 |
| 5,981,314 A | 11/1999 | Glenn et al. | 438/127 |
| 6,001,671 A | 12/1999 | Fjelstad | 438/112 |
| 6,005,778 A | 12/1999 | Spielberger et al. | 361/770 |
| 6,025,640 A | 2/2000 | Yagi et al. | 257/666 |
| RE36,613 E | 3/2000 | Ball | 257/777 |
| 6,051,886 A | 4/2000 | Fogal et al. | 257/777 |
| 6,057,598 A | 5/2000 | Payne et al. | 257/723 |
| 6,072,243 A | 6/2000 | Nakanishi | 257/783 |
| 6,080,264 A | 6/2000 | Ball | 156/292 |
| 6,130,115 A | 10/2000 | Okumura et al. | 438/124 |
| 6,130,473 A | 10/2000 | Mostafazadeh et al. | 257/666 |
| 6,133,637 A | 10/2000 | Hikita et al. | 257/777 |
| 6,143,981 A | 11/2000 | Glenn | 174/52.4 |
| 6,184,463 B1 | 2/2001 | Panchou et al. | 174/52.4 |
| 6,198,171 B1 * | 3/2001 | Huang et al. | 257/787 |
| 6,214,641 B1 | 4/2001 | Akram | 438/107 |
| 6,225,146 B1 | 5/2001 | Yamaguchi et al. | 438/123 |
| 6,229,200 B1 | 5/2001 | Mclellan et al. | 257/666 |
| 6,235,554 B1 | 5/2001 | Akram et al. | 438/109 |
| 6,242,281 B1 | 6/2001 | Mclellan et al. | 438/106 |
| 6,281,568 B1 | 8/2001 | Glenn et al. | 257/684 |
| 6,326,696 B1 | 12/2001 | Horton et al. | 257/777 |
| 6,414,385 B1 * | 7/2002 | Huang et al. | 257/690 |
| 6,476,474 B1 * | 11/2002 | Hung | 257/686 |
| 6,559,525 B2 * | 5/2003 | Huang | 257/675 |

FOREIGN PATENT DOCUMENTS

| | | | |
|---|---|---|---|
| JP | 56062351 | 5/1981 | H01L/25/04 |
| JP | 57-45959 | 3/1982 | H01L/23/28 |
| JP | 59-227143 | 12/1984 | H01L/23/12 |
| JP | 6018731 | 9/1985 | H01L/21/60 |
| JP | 60-195957 | 10/1985 | H01L/23/48 |
| JP | 61-39555 | 2/1986 | H01L/23/36 |
| JP | 61059862 | 3/1986 | H01L/25/04 |
| JP | 61117858 | 6/1986 | H01L/25/08 |
| JP | 62-9639 | 1/1987 | H01L/21/56 |
| JP | 62119952 | 6/1987 | H01L/25/04 |
| JP | 62126661 | 6/1987 | H01L/25/04 |
| JP | 62-126661 | 6/1987 | H01L/25/04 |
| JP | 62142341 | 6/1987 | H01L/25/04 |
| JP | 63128736 | 6/1988 | H01L/23/04 |
| JP | 63-205935 | 8/1988 | H01L/23/28 |
| JP | 63211663 | 9/1988 | H01L/25/08 |
| JP | 63-233555 | 9/1988 | H01L/23/30 |
| JP | 63244654 | 10/1988 | H01L/23/28 |
| JP | 63-244654 | 10/1988 | H01L/23/28 |
| JP | 1028856 | 1/1989 | H01L/27/00 |
| JP | 64001269 | 1/1989 | H01L/25/04 |
| JP | 1071162 A | 3/1989 | H01L/23/52 |
| JP | 1099248 A | 4/1989 | H01L/25/08 |
| JP | 1-106456 | 4/1989 | H01L/23/50 |
| JP | 3169062 | 7/1991 | H01L/25/065 |
| JP | 4028260 | 1/1992 | H01L/25/65 |
| JP | 4-56262 | 2/1992 | H01L/25/65 |
| JP | 4056262 | 2/1992 | H01L/25/065 |
| JP | 4096358 | 3/1992 | H01L/25/065 |
| JP | 4116859 | 4/1992 | H01L/25/065 |
| JP | 4-368154 | 12/1992 | H01L/23/00 |
| JP | 4-368167 | 12/1992 | H01L/25/065 |
| JP | 5013665 | 1/1993 | H01L/25/065 |
| JP | 5-75015 A | 3/1993 | H01L/25/065 |
| JP | 5109975 | 4/1993 | H01L/25/065 |
| JP | 5136323 | 6/1993 | H01L/23/50 |
| JP | 5-283601 | 10/1993 | H01L/23/52 |
| JP | 6-92076 | 4/1994 | H01L/23/00 |

| | | | | | | | | |
|---|---|---|---|---|---|---|---|---|
| JP | 7-312405 | 11/1995 | ........... H01L/23/50 | JP | 9-92775 | 4/1997 | ........... H01L/23/50 |
| JP | 8-125066 | 5/1996 | ........... H01L/23/12 | JP | 10-256470 | 9/1998 | ......... H01L/25/065 |
| JP | 8-306853 | 11/1996 | ........... H01L/23/50 | KR | 94-1979 | 1/1994 | ........... H01L/21/56 |
| JP | 9-8205 | 1/1997 | ........... H01L/23/50 | KR | 97-72358 | 11/1997 | ........... H01L/23/50 |
| JP | 9-8206 | 1/1997 | ........... H01L/23/50 | | | | |
| JP | 9-8207 | 1/1997 | ........... H01L/23/50 | * cited by examiner | | | |

SEMICONDUCTOR PACKAGE INCLUDING STACKED CHIPS WITH ALIGNED INPUT/OUTPUT PADS

BACKGROUND OF THE INVENTION

1. Field of the Invention

The present invention relates to a semiconductor package containing at least two stacked semiconductor chips.

2. Description of the Related Art

Conventionally, a stack-type semiconductor package includes a plurality of semiconductor chips that are vertically stacked one on top of the other on a leadframe substrate or a printed circuit board substrate. The stacked semiconductor chips are electrically connected to each other and to the substrate. Since the package contains a plurality of semiconductor chips, a high degree of functionality is accomplished.

A conventional stack-type semiconductor package 100 is illustrated in FIG. 1. Package 100 of FIG. 1 includes a printed circuit board 1 as a substrate. First circuit patterns, each including a bond finger 5, are formed on an upper surface of a core resin layer 3 of printed circuit board 1. Second circuit patterns, each including a land 7, are formed on an opposite lower surface of resin layer 3. The first and second circuit patterns are electrically connected with each other through conductive via-holes 9 that extend through resin layer 3. A cover coat 11 formed of an insulative resin covers the upper and lower circuit patterns, except for the bond fingers 5 and lands 7, respectively.

A first semiconductor chip 15 is bonded to a center portion of an upper surface of the printed circuit board 1 by adhesive 16. A smaller second semiconductor chip 17 is bonded to an upper surface of the first semiconductor chip 15 by adhesive 16.

Input and output pads 13 of the first and second semiconductor chips 15 and 17 are each connected to a respective one of the bond fingers 5 of printed circuit board 1 by conductive wires 8. A plurality of conductive balls 20 are each fused to a respective one of the lands 7 that are formed on the lower surface of printed circuit board 1.

The first semiconductor chip 15, second semiconductor chip 17, and conductive wires 8 are encapsulated in a package body 18 that is formed using an encapsulating material that is molded onto the upper surface of printed circuit board 1.

The conventional stack-type semiconductor package 100 described above has cost disadvantages because it includes a relatively costly printed circuit board. Moreover, when package 100 is mounted on a motherboard, package 100 has a substantial mounting height above the mounting surface of the motherboard due to the combined heights of the stack of chips, the printed circuit board, the wire loops, and the conductive balls. Furthermore, because the semiconductor chips are fully enclosed by the printed circuit board and the body of hardened encapsulating material, heat generated by the semiconductor chips cannot be easily released to the outside.

SUMMARY OF THE INVENTION

Various embodiments of leadframe-based semiconductor packages for a pair of stacked semiconductor chips are disclosed. An exemplary package includes a plurality of horizontal metal leads. Each lead has a first side, an opposite second side, and an inner end. The second side of each lead includes at least one recessed horizontal surface. The inner ends of the leads face and thereby collectively define a chip placement region wherein the stack of chips is located. The chips are electrically connected to each other in a flip chip style. At least one of the chips extends over the first side of the leads and is electrically connected thereto by bond wires or other conductors such as reflowed metal balls or anisotropic conductive films. The stack of chips is encapsulated in a body of a hardened encapsulating material. The recessed horizontal surface of each of the leads is covered by the encapsulating material, and at least a portion of the second side of each of the leads is exposed as an external connector in a horizontal plane of a first exterior surface of the package body. A surface of one or both of the chips may be exposed at the exterior of the package body to facilitate heat transfer. The stack of chips may be mounted on the first side of the leads or on a chip mounting plate located in the chip placement region.

The disclosed packages provide numerous advantages over the conventional package disclosed above, including a lesser package height above a mounting surface and superior heat dissipation capabilities. In addition, by using a leadframe rather than an internal printed circuit board substrate, the cost of the package is reduced.

These and other features and aspects of the present invention will be better understood in view of the following detailed description of the exemplary embodiments and the drawings thereof.

BRIEF DESCRIPTION OF THE DRAWINGS

Wherever possible, the same reference numerals are used throughout the drawings and the description of the exemplary embodiments to refer to the same or like parts.

DETAILED DESCRIPTION

Figure 2A:
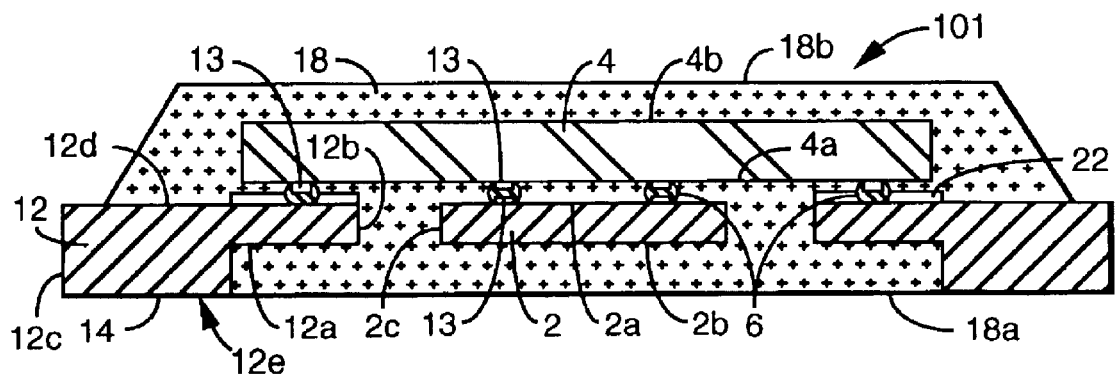
FIGS. 2A and 2B are cross-sectional side views illustrating semiconductor packages in accordance with a first embodiment of the present invention.
Figure 2B:
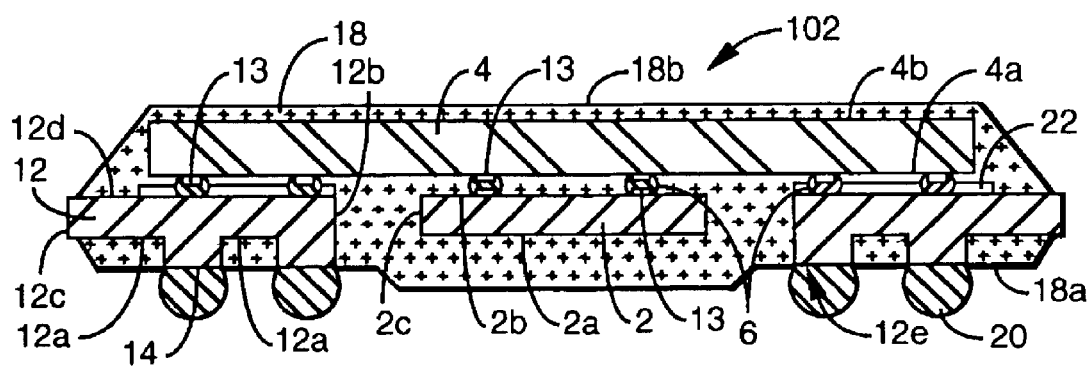

FIGS. 2A and 2B are cross-sectional side views illustrating alternative semiconductor packages 101 and 102, respectively, in accordance with a first embodiment of the present invention. Packages 101 and 102 include a first semiconductor chip 2 that is stacked with a second semiconductor chip 4. Chips 2 and 4 respectively include a first surface 2a or 4a having bond pads 13 formed thereon, and an opposite second surface 2b or 4b. Second semiconductor chip 4 is mounted over first semiconductor chip 2 so that first surface 4a and the bond pads 13 thereon superimpose first surface 2a and the bond pads 13, respectively, of first semiconductor chip 2. As shown, surfaces 4a, 4b of second semiconductor chip 4 are larger in area than the corresponding surfaces 2a, 2b of first semiconductor chip 2, such that a peripheral portion of second semiconductor chip 4 overhangs the peripheral sides 2c of first semiconductor chip 2.

In this embodiment, first surface 4a of second semiconductor chip 4 includes bond pads 13 that are located both on the central portion of first surface 4a that superimposes first surface 2a of first semiconductor chip 2 and on the peripheral portion of first surface 4a that overhangs peripheral sides 2c of first semiconductor chip 2.

A plurality of horizontal metal leads 12 are located at the bottom exterior first surface 18a of package body 18. Leads 12 are collectively provided fully around first semiconductor chip 2, as in a quad package, and below first surface 4a of second semiconductor chip 4. (Alternatively, leads 14 may be provided adjacent to two sides 2c of first chip 2, as in a dual package). The inner ends 12b of the leads 12 face the peripheral sides 2c of first semiconductor chip 2 and thereby collectively define a central area within which first semiconductor chip 2 is located. By having semiconductor 2 and 4 stacked in this way, that is, with first semiconductor chip 2 positioned at a central area laterally between the inner ends 12b of leads 12, the thickness of semiconductor packages 101 and 102 can be remarkably reduced despite having two chips stacked therein.

As shown in FIG. 2A, each lead 12 has an inner end 12b that faces first semiconductor chip 2 and an opposite outer end 12c that is exposed outside of package body 18. An inner portion of the lower side 12e of each lead 12 beginning at inner end 12b is partially etched through in a vertical direction, so as to form a horizontal undercut region, denoted as horizontal recessed surface 12a, of a predetermined depth. A remaining portion of the lower side 12e of each lead 12 that is laterally between recessed surface 12a and the outer end 12c of the lead 12 defines a land 14. Lands 14 are exposed at lower first surface 18a of package body 18 and are the input/output terminals of package 101. During the encapsulation step, the encapsulating material that forms package body 18 fills in under recessed surface 12a, thereby preventing the lead 12 from being pulled vertically from body 18.

Alternatively, the lower side 12e of each lead 12 may include a plurality of undercut regions each formed by partially etching through the thickness of lead 12. For example, as shown in FIG. 2B, each lead 12 includes two horizontal recessed surfaces 12a at the lower side of the lead. By having the two partial etched parts 12a, two lands 14 are defined on the lower surface of each lead 12. When viewed from below, the lands 14 of the plurality of leads 12 are exposed and collectively arrayed at a lower horizontal first surface 18a of package body 18 in such a way as to produce rows and columns of lands 14 at first surface 18a.

The input and output pads 13 of first semiconductor chip 2 each superimpose one of a centrally located subset of the input and output pads 13 of second semiconductor chip 4 and are electrically connected thereto in a flip chip style by conductive connection means 6. The remaining peripheral input and output pads 13 of second semiconductor chip 4 each superimpose the upper first side 12d of a respective one of the leads 12, and are electrically connected thereto in a flip chip style by conductive connection means 6.

Metal balls, such as gold balls or solder balls, can be used as connection means 6. Alternatively, instead of using metal balls, an anisotropic conductive film (ACF) can be used as connection means 6.

Each anisotropic conductive film comprises an amalgamation of a conventional bonding film and conductive metal grains. A thickness of the bonding film is about 50 $\mu$m, and a diameter of each conductive metal grain is about 5 $\mu$m. A surface of the conductive metal grain is coated with a thin polymer layer. If heat or pressure is applied to a predetermined region of the anisotropic conductive film, the thin polymer layers of the conductive metal grains in the predetermined region are melted so that adjacent metal grains become connected, thereby providing conductivity. The thin polymer layer of the remaining conductive metal grains, i.e., those not included in the predetermined region, are maintained in an insulated status. Therefore, a position setting operation between two component elements to be electrically connected can be implemented in an easy manner.

In a case where gold balls or solder balls (or other metal balls) are used as the conductive connection means 6, after the gold balls or solder balls are fused to predetermined regions of the semiconductor chip or the leads, a reflow process must be performed after a position setting operation in order to make an electrical connection. On the other hand, where the anisotropic conductive films are used as the conductive connection means 6, after the anisotropic conductive films are applied over relatively wide areas on the semiconductor chip or the leads, and the semiconductor chip and the leads are properly positioned with respect to each other, then the semiconductor chip and the leads can be electrically connected with each other by simply exerting a pressing force of a desired level. For example, if the anisotropic conductive films are applied over wide areas on the second semiconductor chip 4 or the upper first side 12d of the leads 12, then by bringing the second semiconductor chip 4 and the leads 12 into close contact with each other, the input and output pads 13 of the second semiconductor chip 4 exert pressure onto predetermined regions of the anisotropic conductive films, whereby the peripheral input and output pads 13 of the second semiconductor chip 4 and the upper first first side 12d of the respective leads 12 are electrically connected with each other.

Accordingly, while it is illustrated in the drawings that metal balls are used as the conductive connection means 6, practitioners should understand that the metal balls can be replaced with anisotropic conductive films in all embodiments of the present invention. Using a flip chip style mounting for second semiconductor chip 4 on leads 12 through a connection means 6 eliminates the need for conductive wires, as in FIG. 1, thereby eliminating the need for package body 18 to cover the apex of the wire loops, and subsequently reducing the height of the semiconductor packages 101 and 102.

Also, where metal balls are used as the conductive connection means 6, insulating layers 22 of a predetermined thickness may be coated on the upper first first side 12d of each of the leads 12 around the surface portions thereof where the leads 12 are connected with the peripheral input and output pads 13 of the second semiconductor chip 4. The insulating layers 22 each prevent the metal ball that is bonded from overflowing the desired bonding area, whereby shorts between adjacent balls, inferior connections between the second semiconductor chip 4 and the leads 12, or the like, can be avoided. The insulating layer 22 on first first side 12d of each lead 12 has an aperture through which the metal ball can be inserted to accurately locate the connection means 6 to the appropriate area of upper first side 12d of the lead 12 for bonding thereto.

While a variety of materials can be used to form the insulating layer 22, it is preferred that a solder mask, a cover coat or polyimide be employed.

The first semiconductor chip 2, second semiconductor chip 4, conductive connection means 6 and leads 12 are encapsulated in a package body 18 formed from an insulative encapsulating material. The encapsulation step is performed so that at least a portion of the lower side 12e of each of the leads 12, in particular, the land(s) 14, are exposed to the outside in the horizontal plane of lower first surface 18a of package body 18. Because the recessed surface 12a of each lead 12 is covered (i.e., underfilled) by the encapsulating material of package body 18, the lead 12 is prevented from disengaging from the package body 18 in a horizontal or vertical direction and instead is maintained in a rigidly secured status. Typically, encapsulation is performed by molding and curing an insulative resin (e.g., epoxy) material. Alternatively, a liquid encapsulant may be used.

The exposed lands 14 at lower first surface 18a of the package body 18 of semiconductor package 101 can be electrically connected to a motherboard using solder. Also, as can be readily seen from FIG. 2B, optional conductive balls 20, such as lead tin solder balls, can be fused to the exposed lands 14, as in a ball grid array package, so that the semiconductor package 102 can be electrically connected to a motherboard.

Figure 3A:
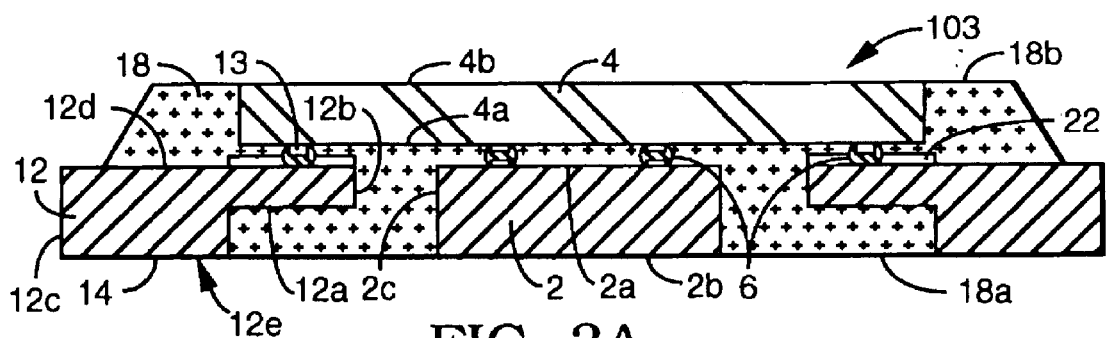
FIGS. 3A and 3B are cross-sectional side views illustrating semiconductor packages in accordance with a second embodiment of the present invention.
Figure 3B:
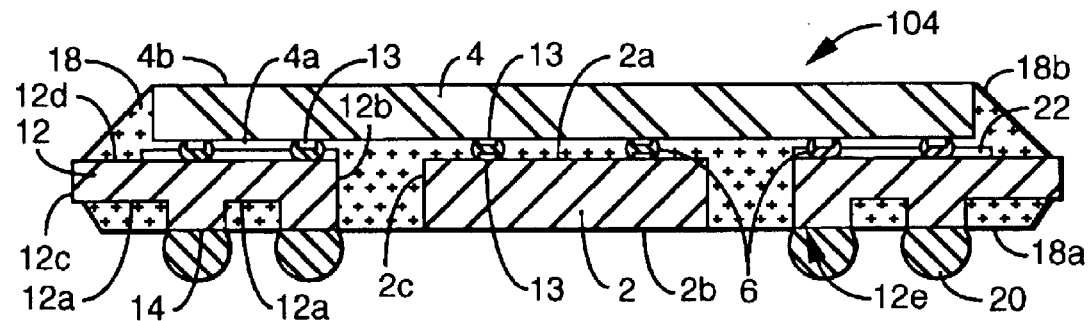

FIGS. 3A and 3B are cross-sectional side views illustrating semiconductor packages 103 and 104 in accordance with a second embodiment of the present invention. Since semiconductor packages according to this second embodiment of the present invention are constructed in a similar manner to the semiconductor packages of the first embodiment discussed above, only differences existing therebetween will be described hereinbelow.

As shown in FIGS. 3A and 3B, the encapsulation step (typically a molding process) is performed so that inactive second surface 2b of first semiconductor chip 2 is exposed to the outside at a horizontal lower first surface 18a of package body 18. Moreover, inactive second surface 4b of second semiconductor chip 4 is exposed in the horizontal plane of the horizontal upper second surface 18b of the package body 18. Accordingly, heat generated in the first semiconductor chip 2 can be released or dissipated into the air through the exposed second surface 2b, and heat generated in second semiconductor chip 4 can be released or dissipated into air through the exposed second surface 4b and through the leads 12. As a consequence, the heat dissipation capability of semiconductor package 103, 104 is drastically improved by comparison to the package of FIG. 1.

Moreover, in the case of semiconductor package 104 of FIG. 3B, a layer of a conductive paste (not shown), for example, a solder paste, may be formed on the exposed second surface 2b of first semiconductor chip 2. The layer of conductive paste has a vertical thickness similar to that of the conductive balls 20. During a process of mounting such a semiconductor package 104 on a motherboard, the conductive paste can be connected to a heat sink or ground terminal of the motherboard, whereby heat generated in the first semiconductor chip 2 can be easily transferred to the motherboard and from there into air.

Figure 4A:
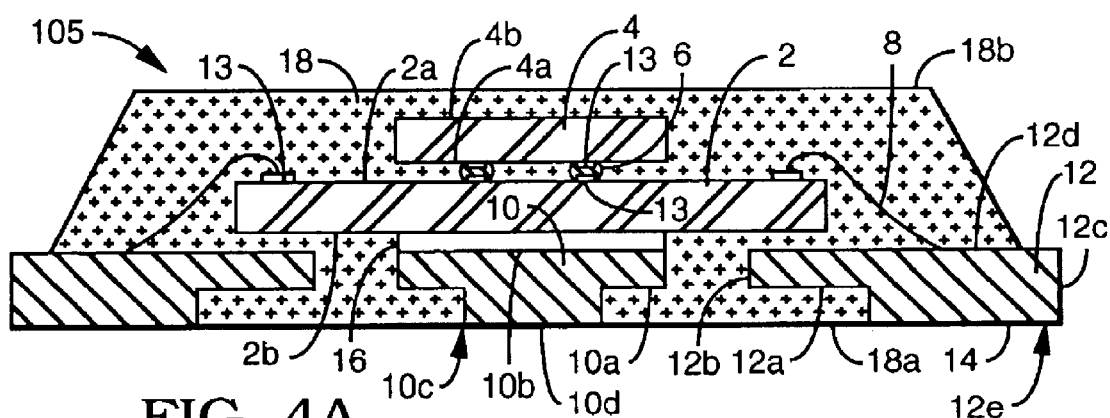
FIGS. 4A and 4B are cross-sectional side views illustrating semiconductor packages in accordance with a third embodiment of the present invention.
Figure 4B:
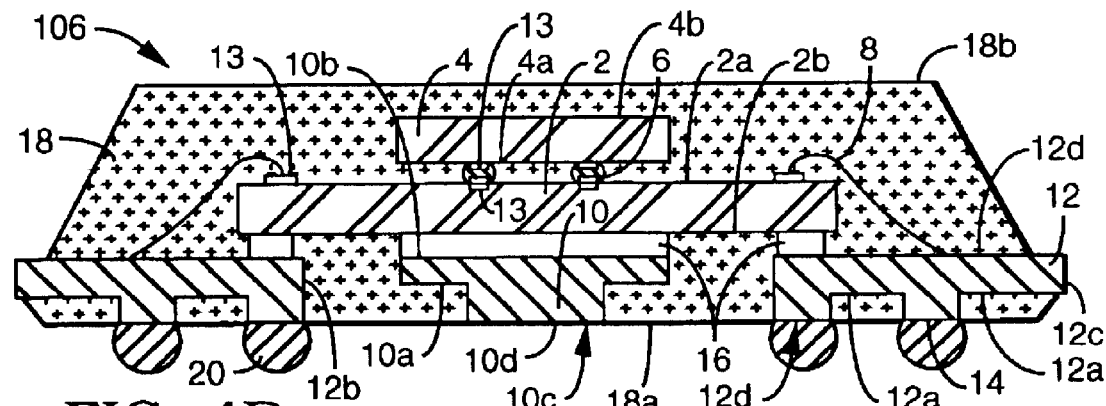

FIGS. 4A and 4B are cross-sectional side views illustrating semiconductor packages 105 and 106 in accordance with a third embodiment of the present invention. Again, our discussion will focus on the differences between these packages and those discussed above, rather than again describing the many similar features.

Packages 105, 106 include a first semiconductor chip 2 having an active first surface 2a on which a plurality of input and output pads 13 are formed, and a second semiconductor chip 4 having an active first surface 4a on which a plurality of input and output pads 13 are formed. First semiconductor chip 2 is larger than second semiconductor chip 4, and includes input and output pads 13 both at central and peripheral portions of first surface 2a. Second semiconductor chip 4 is mounted in a flip chip style on first semiconductor chip 2 so that the first surface 4a of semiconductor chip 4, including the input/output pads 13 thereon, superimposes a central portion of first surface 2a of first semiconductor chip 2. The input/output pads 13 of second semiconductor chip 4 are each superimposed and are electrically connected to a respective one of the central input/output pads 13 located on the central portion of first surface 2a of first semiconductor chip 2.

A metal die pad, called chip mounting plate 10 herein, is provided at a central region of package 105, 106. Chip mounting plate 10 has a rectangular shape perimeter, and a first side 10b to which inactive second surface 2b of first semiconductor chip 2 is bonded with an adhesive 16, which may be a layer of an adhesive resin (e.g., epoxy), an adhesive film, or a double sided tape. An opposite second side 10c of chip mounting plate 10 includes a central surface 10d that is exposed in the horizontal plane of horizontal exterior first surface 18a of package body 18 inside of lands 14 of leads 12. A horizontal undercut region, denoted as recessed surface 10a, is formed by partially etching through chip mounting plate 10 from second side 10c toward first side 10b. Recessed surface 10a surrounds lower central surface 10d. Since horizontal recessed surface 10a is recessed from and fully surrounds central surface 10d, chip mounting plate 10 has a lip at first surface 10a that fully surrounds chip mounting plate 10.

A plurality of horizontal leads 12 are provided around two or all four sides of chip mounting plate 10. The leads 12 are in the same horizontal plane as chip mounting plate 10, with a predetermined separation between an inner end 12b of each lead and the periphery of chip mounting plate 10. Inner end 12b faces chip mounting plate 10.

As shown in FIG. 4A, an inner portion of the lower side 12e of each lead 12, beginning at inner end 12b of the lead 12, has a horizontal recessed surface 12a of a predetermined depth. The remaining portion of the lower side 12e of each lead 12, i.e., the portion from recessed surface 12a outward to exposed outer end 12c of the lead 12, defines a land 14 exposed in the horizontal plane of horizontal first surface 18a of body 18.

In FIG. 4B, each lead 12 is undercut at two locations of the lower side of the lead 12 so as to have two horizontal recessed surfaces 12a. The two recessed surfaces 12a define two lands 14 at the lower side of each lead 12. Lands 14 are exposed at horizontal first surface 18a of body 18 and function as input/output terminals of the package. Optionally, conductive balls 20 may be fused to lands 14. When viewed from below, the lands 14 of the plurality of leads 12 are arrayed in such a way as to produce rows and columns at lower first surface 18a of package body 18.

Referring to FIGS. 4A and 4B, the first semiconductor chip 2 extends over the upper first side 12d of the leads 12. In other words, a peripheral portion of second surface 2b of first semiconductor chip 2 overhangs the sides of chip mounting plate 12 and superimposes the upper first side 12d of leads 12. This peripheral portion of second surface 26 may be bonded to the upper first side 12d of each of the leads 12 by a layer of insulative adhesive 16, as in FIG. 4B. Accordingly, leads 12 support the overhanging periphery of first semiconductor chip 2, which can prevent first semiconductor chip 2 from being tilted during a wire bonding process.

During the wire bonding process, the peripheral input and output pads 13 on first surface 2a of first semiconductor chip 2 that are not superimposed by second semiconductor chip 4 are each electronically connected to the upper first side 12d of respective leads 12 by conductive wires 8, which may be gold wires or aluminum wires. The upper first side 12d of the leads 12 can be plated with gold (Au), silver (Ag), palladium (Pd) or the like so as to provide a stronger connection with the conductive wires 8. The centrally-located input and output pads 13 of the first semiconductor chip 2, i.e., those superimposed by the input/output pads 13 of second semiconductor chip 4, are electrically connected thereto by conductive connection means 6.

Here, as described above, the conductive connection means 6 can be selected from a group consisting of metal balls (e.g., gold or solder balls) and anisotropic conductive films, among other possibilities.

The first semiconductor chip 2, second semiconductor chip 4, chip mounting plate 10, leads 12, conductive wires 8 and conductive connection means 6 are encapsulated (e.g., by molding) using an insulative encapsulating material, in a manner such that the central surface 10d of the lower second side 10c chip mounting plate 10 and the lands 14 of each of the leads 12 are exposed to the outside in the horizontal plane of first surface 18a of package body 18, while recessed surface 12a is covered by the encapusulating material. Accordingly, heat generated in the first semiconductor chip 2 and the second semiconductor chip 4 is dissipated to the outside through the chip mounting plate 10 and leads 12. Accordingly, the heat dissipation capability of the entire semiconductor packages 105 and 106 is markedly improved by comparison to the conventional package of FIG. 1.

Semiconductor package 105 of FIG. 4A can be electrically connected to a motherboard by bonding solder between each land 14 and a terminal of the motherboard. Semiconductor package 106 of FIG. 4B can be electrically connected to a motherboard by fusing the conductive ball 20 previously formed on land 14 of each lead 12 to the terminals of the motherboard. In addition, a conductive layer, such as a solder paste, having a bond line thickness similar to that of the conductive balls 20 can be formed on the exposed lower central surface 10d of the chip mounting plate 10 of the semiconductor package 106 of FIG. 4B. As described above, such a conductive layer may later be connected to a heat sink or ground terminal of the motherboard, so as to transfer heat generated in the first and second semiconductor chips 2 and 4 through chip mounting plate 10 to the motherboard.

Figure 5A:
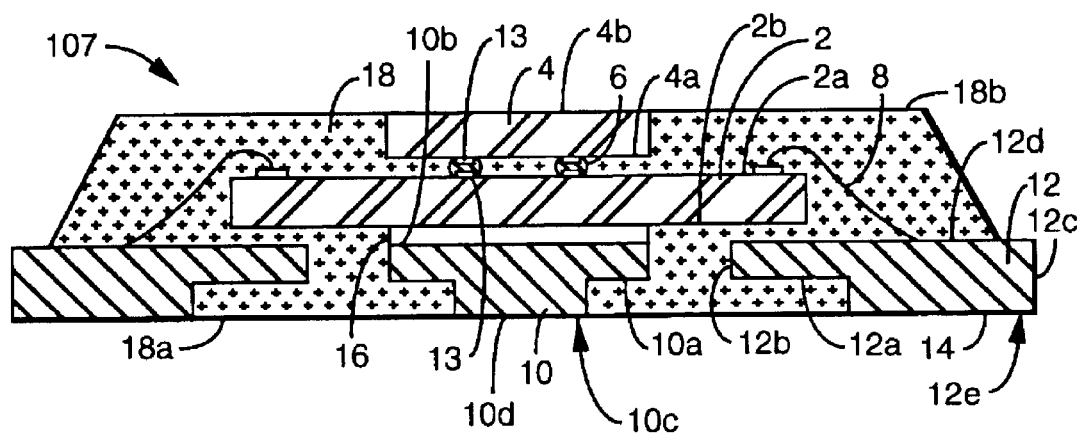
FIGS. 5A and 5B are cross-sectional side views illustrating semiconductor packages in accordance with a fourth embodiment of the present invention.
Figure 5B:
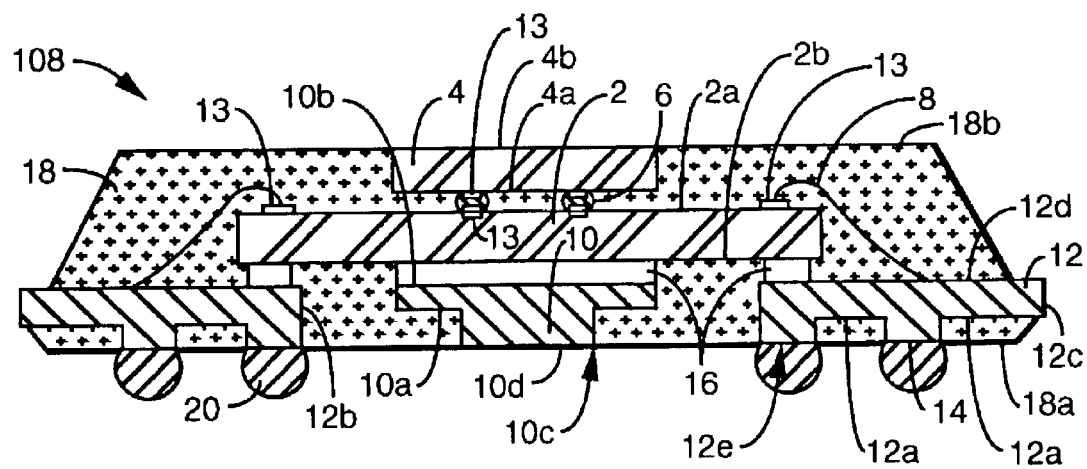

FIGS. 5A and 5B are cross-sectional side views illustrating semiconductor packages 107 and 108 in accordance with a fourth embodiment of the present invention. Since semiconductor packages according to this fourth embodiment of the present invention are constructed in a similar manner to the semiconductor packages according to the third embodiment of the present invention, only differences existing therebetween will be described hereinbelow.

As shown in FIGS. 5A and 5B, an upper, inactive second surface 4b of second semiconductor chip 4 is exposed externally in the horizontal plane of horizontal second surface 18b of package body 18, similar to FIGS. 3A and 3B. Accordingly, heat generated in first semiconductor chip 2 and second semiconductor chip 4 is released into air through the lower first surface 10c of chip mounting plate 10 and through the exposed second surface 4b of second semiconductor chip 4. Accordingly, the heat releasability of the entire semiconductor package 107, 108 is improved.

Further, as in the packages of FIGS. 2A and 2B, semiconductor packages 107 and 108 may have a conductive connection means 6 selected from a group consisting of metal balls (e.g., gold or solder balls) and anisotropic conductive films. Also, in the case of the semiconductor package 108 in FIG. 5B, a layer conductive of a conductive paste can be further formed on the exposed lower central surface 10d of the chip mounting plate 10.

Figure 1:
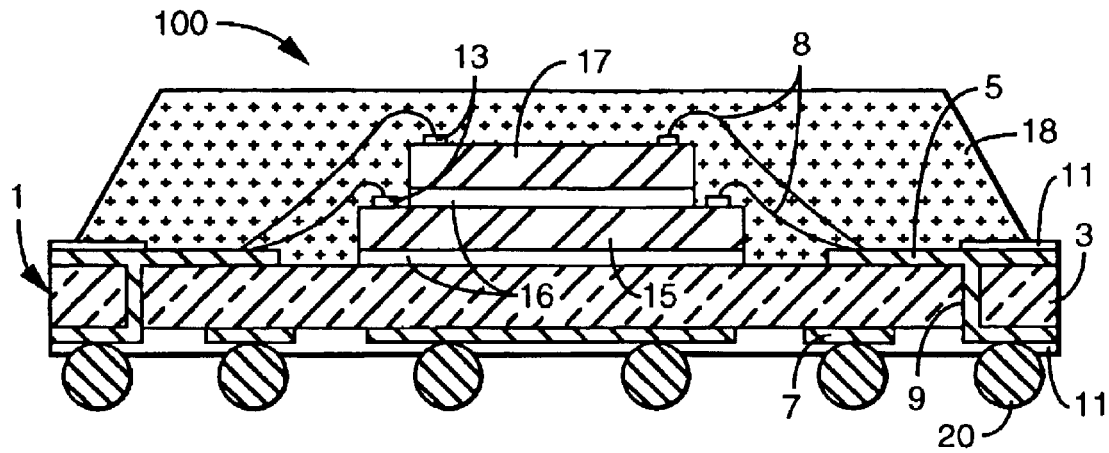
FIG. 1 is a cross-sectional side view illustrating a conventional semiconductor package.

The semiconductor packages described above feature an inexpensive leadframe in place of the costly printed circuit board of FIG. 1, thereby reducing a manufacturing cost of the semiconductor package. Further, the leadframe is at the bottom of the package body, which reduces package height.

Also, in some of the embodiments where a lower semiconductor chip is positioned in an empty central area defined between the inward facing ends of the leads, which are separated from each other by a predetermined distance, the thickness of the entire semiconductor package is decreased.

Moreover, the use of flip-chip style conductive connection means for electrically interconnecting the two stacked chips to each other and, in some cases, for electrically connecting the larger one of the chips to the leads, eliminates the need for one or both sets of bond wires (compare FIG. 1), thereby reducing the thickness of the semiconductor package still further.

Further, in embodiments where the inactive surface of one or both of the stacked semiconductor chips are exposed out of the package body, or where the inactive surface of the upper one of the two stacked semiconductor chips and a surface of a chip mounting plate are exposed out of the package body, the heat releasability of the entire semiconductor package is improved by the comparison to the package of FIG. 1.

Furthermore, in the case where a layer of a conductive paste is formed on either an exposed lower inactive surface the lower chip of the stack or on the exposed lower surface of a chip mounting plate, the conductive paste layer can be thermally and/or connected to a motherboard to which the package is mounted, thereby providing an additional heat dissipation path ground voltage source for the mounted package.

In addition, when the semiconductor chips and the leads are electronically interconnected using conductive metal balls as the conductive connection means, an insulating layer of a predetermined thickness and having a central aperture can be coated on the upper surface of the respective leads. The metal balls (e.g., gold balls or solder balls) can each be fused to the upper surface of a respective one of the leads through the aperture in the insulating layer, thereby ensuring that an accurate conductive connection between the chip and lead is implemented in an easy and reliable manner.

In the drawings and specification, although specific terms may be employed in describing the exemplary embodiments, they are used in a generic and descriptive sense only and not for purposes of limitation. The scope of the invention is set forth in the following claims.

What is claimed is:

1. A semiconductor package comprising:
    a plurality of horizontal metal leads, each of the leads having a first side, an opposite second side, and an inner end, wherein the inner ends of the leads each face a central region in a horizontal plane of the leads;
    a first semiconductor chip having input/output pads, said first chip located in the central region;
    a second semiconductor chip having central input/output pads and peripheral input/output pads, wherein each of the central input/output pads superimposes and is electrically connected to a respective one of the input/output pads of the first semiconductor chip, and each of the peripheral input/output pads superimposes and is electrically connected to the first side of a respective one of the leads; and
    a package body formed of a hardened encapsulating material, wherein at least portions of the first and second semiconductor chips are encapsulated in the package body, and at least a portion of the second side of each of the leads is exposed at a horizontal first exterior surface of the package body.

2. The semiconductor package of claim 1, wherein the second side of each of the leads includes at least one recessed horizontal surface covered by said encapsulating material.

3. The semiconductor package of claim 1, wherein the second side of each of the leads includes a recessed horizontal surface at the inner end of the lead, said recessed horizontal surface being covered by said encapsulating material.

4. The semiconductor package of claim 1, wherein the second sides of the leads exposed at said first exterior surface collectively form rows and columns.

5. The semiconductor package of claim 1, wherein the input/output pads of the first semiconductor chip are each electrically connected to the central input/output pads of the second semiconductor chip, and the peripheral input/output pads of the second semiconductor chip are each electrically connected to respective ones of the first sides of the leads, by one of a reflowed metal ball and an anisotropic conductive film.

6. The semiconductor package of claim 1, further comprising an insulative layer on the first side of each of the leads, wherein the peripheral input/output pads of the second semiconductor chip are electrically connected to the first sides of respective ones of the leads through said insulative layer.

7. A semiconductor package comprising:
a plurality of horizontal metal leads, each of the leads having a first side, an opposite second side, and an inner end wherein the second side of each of the leads includes at least one recessed horizontal surface and the inner ends of the leads face a central chip placement region;
first and second semiconductor chips stacked in said chip placement region, each of said chips having input/output pads, wherein at least some of the input/output pads of the first semiconductor chip face and are electrically connected to respective ones of the input/output pads of the second semiconductor chip by a first conductor, and other input/output pads of one of the first and second semiconductor chips are over the first sides of the leads and are each electrically connected to the first side of a respective one of the leads by a second conductor; and
a package body formed of a hardened encapsulating material, wherein at least portions of the first and second semiconductor chips and the conductors are encapsulated in the package body, the recessed horizontal surface of each of the leads is covered by the encapsulating material, and at least a portion of the second side of each of the leads is exposed at a horizontal first exterior surface of the package body.

8. The semiconductor package of claim 7, wherein the input/output pads over the first sides of the leads each face and are electrically connected to respective ones of the first sides of the leads.

9. The semiconductor package of claim 7, wherein the first and second conductors are each a reflowed metal ball.

10. The semiconductor package of claim 7, wherein the first and second conductors are each an anisotropic conductive film.

11. The semiconductor package of claim 7, wherein one of the first and second semiconductor chips is in a horizontal plane with the leads in said chip placement region.

12. The semiconductor package of claim 7, further comprising an insulative layer on the first side of each of the leads, wherein certain ones of the input/output pads of the second semiconductor chip are electrically connected to the first sides of respective ones of the leads through the insulative layer.

13. The semiconductor package of claim 7, wherein the second sides of the leads exposed at the first exterior surface collectively form rows and columns.

14. The semiconductor package of claim 1, wherein the peripheral input/output pads of the second semiconductor chip superimposing the first sides of the leads each face and are electrically connected to respective ones of the first sides of the leads.

15. The semiconductor package of claim 1, wherein the first semiconductor chip is in a horizontal plane with the leads in the central region.

16. A semiconductor package comprising:
a plurality of leads each defining opposed first and second sides and an inner end, the leads being arranged such that the inner ends collectively define a central region;
a first semiconductor chip disposed in the central region and having a plurality of input/output pads;
a second semiconductor chip having a plurality of central input/output pads and a plurality of peripheral input/output pads, each of the central input/output pads being aligned with and electrically connected to a respective one of the input/output pads of the first semiconductor chip, with each of the peripheral input/output pads being aligned with and electrically connected to the first side of a respective one of the leads; and
a package body at least partially encapsulating the leads and the first and second semiconductor chips such that at least a portion of the second side of each of the leads is exposed in an exterior surface of the package body.

17. The semiconductor package of claim 16, wherein the second side of each of the leads includes at least one recessed surface which is covered by the package body.

18. The semiconductor package of claim 16, wherein the second side of each of the leads includes a recessed surface which extends to the inner end and is covered by the package body.

19. The semiconductor package of claim 16, wherein the second sides of the leads exposed in the package body collectively form rows and columns.

20. The semiconductor package of claim 16, wherein the input/output pads of the first semiconductor chip are electrically connected to respective ones of the central input/output pads of the second semiconductor chip, and the peripheral input/output pads of the second semiconductor chip are electrically connected to respective ones of the first sides of the leads by a reflowed metal ball.

21. The semiconductor package of claim 16, wherein the input/output pads of the first semiconductor chip are electrically connected to respective ones of the central input/output pads of the second semiconductor chip, and the peripheral input/output pads of the second semiconductor chip are electrically connected to respective ones of the first sides of the leads by an anisotropic conductive film.

22. The semiconductor package of claim 16, further comprising an insulative layer disposed on the first side of each of the leads, the peripheral input/output pads of the second semiconductor chip being electrically connected to the first sides of respective ones of the leads through the insulative layer.

23. The semiconductor package of claim 16, wherein the peripheral input/output pads of the second semiconductor die each face and are electrically connected to respective ones of the first sides of the leads.

24. The semiconductor package of claim 16, wherein the first semiconductor chip defines a surface which extends in generally co-planar relation to the first surfaces of the leads.

* * * * *